United States Patent [19]

Peterson

[11] 3,859,606

[45] Jan. 7, 1975

[54] RECEIVER HAVING PREAMPLIFIER AND MULTICOUPLER

[75] Inventor: Eugene A. Peterson, Penfield, N.Y.

[73] Assignee: Edmac Associates Inc., Rochester, N.Y.

[22] Filed: July 19, 1973

[21] Appl. No.: 380,687

Related U.S. Application Data

[63] Continuation of Ser. No. 191,199, Oct. 21, 1971, abandoned.

[52] U.S. Cl. .................... 330/53, 330/157, 330/165

[51] Int. Cl. .............................................. H03f 3/60

[58] Field of Search ....................................... 330/53

[56] References Cited

UNITED STATES PATENTS

| | | | |
|---|---|---|---|
| 3,423,688 | 1/1969 | Seidel | 330/53 |
| 3,426,292 | 2/1969 | Seidel | 330/126 |
| 3,444,475 | 5/1969 | Seidel | 330/53 |
| 3,474,348 | 10/1969 | Cohen | 330/53 |

*Primary Examiner*—Nathan Kaufman

[57] ABSTRACT

Apparatus is disclosed which includes a preamplifier and a multicoupler and is responsive to VHF input signal received from a device such as an antenna to produce output signals to several independent signal processors. The preamplifier includes at least two stages, with each such stage having two amplifiers paralleled by quadrature hybrid couplers.

1 Claim, 2 Drawing Figures

EUGENE A. PETERSON
INVENTOR.
BY Raymond L. Owens
att'y

RECEIVER HAVING PREAMPLIFIER AND MULTICOUPLER

This application is a Continuation of Application Ser. No. 191,199, filed Oct. 21, 1971, now abandoned.

BACKGROUND OF THE INVENTION

Heretofore, in one application, a preamplifier and multicoupler is used in sonobuoy receiver systems in the FM VHF frequency in a band say from between 162 to 174 megahertz. The preamplifier multicoupler is attached to an aircraft antenna from which it is subjected to a wide range of signal levels and frequencies. Such devices have been deficient in at least one of three requirements: low noise figure, low input VSWR, or large signal handling capability. A low noise figure (in the region of 3 dB) may be achieved if there is a mismatch at the amplifying device input. However, this condition may adversely affect the response of the system. A low noise figure can also be obtained by having a large signal gain in the preamplifier-multicoupler which raises the relatively low threshold input signal level well above the noise level of the inherently noisy signal conversion stages in the succeeding receiver stages. However, this large gain increases the level of moderately high signal inputs so that such signals are distorted in the following receiver stages; and spurious frequencies may be produced which cause false responses in the receiver.

SUMMARY OF INVENTION

Accordingly, it is an object of this invention to provide a preamplifier and multicoupler especially suitable for use in sonobuoy receiver systems, which optimizes the sensitivity and dynamic range of a receiving system. A further object is to provide optimum noise figure with low input VSWR and gain stability with temperature.

In the disclosed embodiment of the invention there is provided a preamplifier and multicoupler, the preamplifier including first and second stages, with each such stage having two amplifiers paralleled by quadrature hybrid couplers. The first stage may receive a signal from an antenna and the second stage may provide an output signal to a directional coupler which provides two signals, one of which is provided to a second receiver system with the remaining siganl being provided to a hybrid divider multicoupler which provides a plurality of output signals.

A feature of the invention is that the apparatus in accordance therewith maintains a low noise figure, a low input VSWR and a high signal level handling capability. In the specific embodiment an apparatus has been built having a 3 dB noise figure and a 20 dB power gain, with an input VSWR of 1.2:1. The particular gain was determined by specifications which required multiple outputs (and therefore an inherent insertion loss) and a 5 dB system input noise figure at the preamplifier-multicoupler input when followed by a receiver noise figure of 16 dB.

DESCRIPTION OF THE PREFERRED EMBODIMENT

Figure 1:
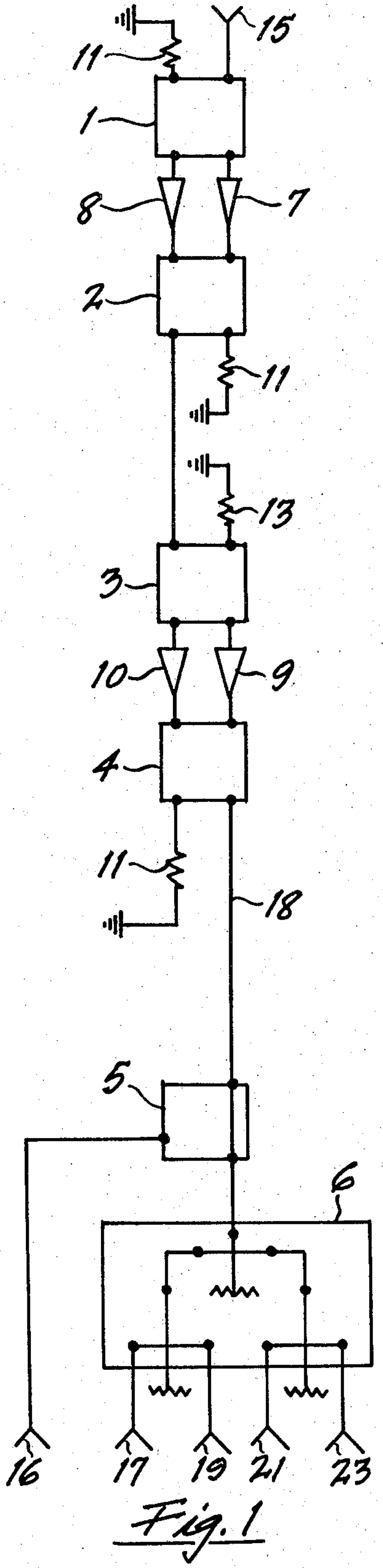
FIG. 1 is a diagram partially in block and partially in schematic form of a preamplifier and multicoupler embodying the inventions.

Turning first to FIG. 1 of the drawing, there is shown a preamplifier-multicoupler (P-M). The preamplifier portion of this apparatus includes two stages. The first amplification stage includes two amplifiers 7 and 8 paralleled by quadrature hybrid couplers 1 and 2. By that is meant each amplifier 7 and 8 receives a single input from the coupler 1 and provides a single output to the coupler 2.

Figure 2:
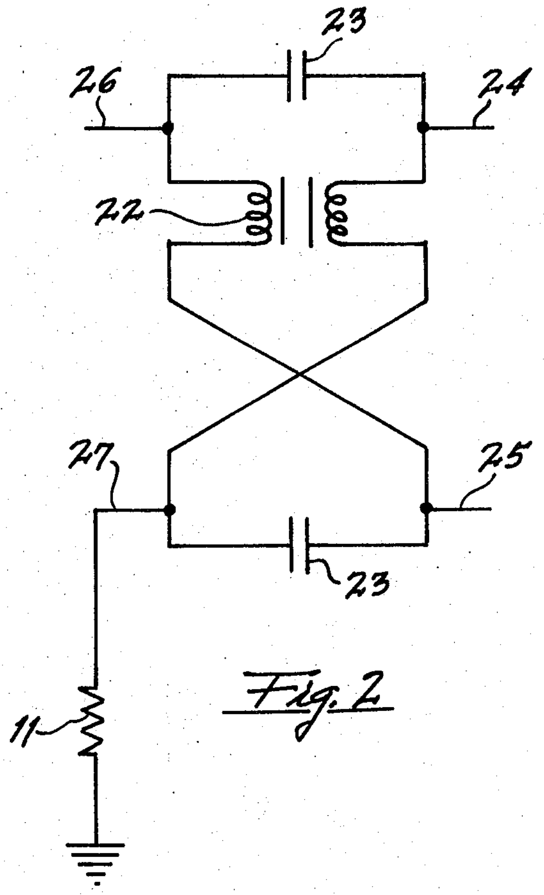
FIG. 2 is a drawing of a hybrid coupler which may be used in the apparatus shown in FIG. 1.

The design of the second stage is substantially the same as the first. In accordance with the invention, the amplifiers 7, 8, and 9 and 10 of the second stage all may be provided by commercially available circuits such as amplifier Model AM-320-BH manufactured by Lorch Electronics Corp. As shown the first stage includes two hybrid couplers 1 and 2 and the second stage includes hybrid couplers 3 and 4. Hybrid couplers which may be used in accordance with the invention are commercially available such as Model QHM-3-160, manufactured by Merrimac Research and Development Inc. FIG. 2 shows an exemplary coupler which may be employed and includes a transformer 22 and capacitors 23 which are tuned so that at the frequency and impedance of intended operation, a signal incident at port 26 will divide equally into two signals at 24 and 25 which are 90 electrical degrees apart in phase. If the loads at ports 24 and 25 are equal in phase and magnitude, any reflections will be directed to ports 26 and 27 with 90 degrees separation. The reflections from ports 24 and 25 will cancel at the input port 26 resulting in a low VSWR. The reflections will add at port 27 and be dissipated in isolated resistor 11 also shown schematically in FIG. 1. In FIG. 1 the couplers are adapted to direct reflections from equal mismatches at the inputs and outputs into such isolated resistive loads 11. Since no reflections appear on the signal input and output ports of the couplers the VSWR remains near 1.0 despite severe mismatches at the amplifiers 1 and 2. This allows mismatch at the amplifier inputs for optimum noise figure and for wide bandwidth, it also allows mismatch at the amplifier outputs for variable load temperature compensation. This first stage may in a typical sonobuoy application have an 11 dB gain, a 2.7 dB noise figure and a 1.2 to 1 input VSWR. The second amplifier stage is functionally identical. High power devices are required to handle the amplified signal levels from the first stage. A 4 dB noise figure is obtained with a 16 dB gain and a 1.5 to 1 input VSWR. The output of the coupler 4 is provided in a lead 18 to a directional coupler 5. Directional couplers are well known in the art and function to pass a signal from input to output while conducting a portion of the input signal to a third port. A signal incident at the output port will be conducted to the input port but will not appear at the third port. Directivity is the ratio of the signals at the third port (coupled port) with a signal incident at the input versus the output port.

The model MDC-17 manufactured by Anzac Electronics has been found to perform well in accordance with the invention. This coupler is a 20 dB directional coupler with a 0.3 dB insertion loss and a 20 dB directivity.

The coupler 5 provides an output over a lead 16 to a second receiver system. The directivity reduces the local oscillator conduction from the receivers on the four multicoupler outputs 17, 19, 21 and 23 to the second receiver output. A reactive four way hybrid multicoupler divider 6 provides such four balanced receiver outputs. An exemplary multicoupler which may be used is Model DS–112 manufactured by Anzac Electronics. In such device a 25 dB isolation is obtainable between outputs with a 2° phase and 0.5 dB gain balance.

The use of quadrature hybrid couplers 1, 2, 3 and 4 for paralleling the amplifiers provides the following features and advantages.

1. Allows mismatch at amplifier (7, 8, 9, 10) inputs with a simultaneous low coupler input VSWR.
2. Allows a larger signal handling capability over a single amplifier.
3. Allows mismatch at amplifier outputs 7, 8 for optimum loading, best dynamic range, and broad bandwidth without a large coupler output VSWR.
4. The low resultant VSWR's allow cascading stages with stable and predictable performance.
5. The low VSWR at the second stage output determines the directivity of the directional coupler 5. It also determines the isolation between outputs in the four way divider 6.

A low noise high dynamic range preamplifier-multicoupler for use in a 162 to 174 MHz sonobuoy receiver in accordance with the teaching of the present invention has been built. This particular apparatus has less than a 3 dB noise figure and can linearly handle a 0 dBm input signal. This represents a linear dynamic range of 141 dB (referenced to a 1.0 kHz noise bandwidth). Third order intermodulation products are 80 dB down from two −30 dBm inputs. This apparatus provides four isolated equal phase, equal gain (20 dB) outputs to drive four receiver modules. An additional output at 7 dB gain is provided to drive an additional load such as another receiver system.

We claim:

1. For use in a sonobuoy receiver system responsive to an input VHF signal from an antenna or the like, the combination comprising:

a. a preamplifier including:
   i. a first amplifier stage having first and second amplifiers each including one input and one output terminal respectively and first and second 90° couplers with said first coupler being connected to the input terminal of said first and second amplifiers respectively, the input of said first coupler being connected to said antenna, and said second coupler being connected to the output terminal of said first and second amplifiers respectively,
   ii. a second circuit state cascaded to said first circuit stage and having third and fourth amplifiers each including one input and one output terminal respectively and third and fourth 90° couplers with said third coupler being connected to the input terminal of said third and fourth amplifiers respectively, the input of said third coupler being connected to the output of said second coupler, and said fourth coupler being connected to the output terminal of said third and fourth amplifiers resepctively, and;
   iii. said first, second, third and fourth couplers each including a transformer having primary and secondary windings and first and second capacitors, said first capacitor being connected to one side of the primary and secondary windings of said transformer, and said second capacitor being connected to the other side of said primary and secondary windings of said transformer;
b. a directional coupler coupled to said fourth coupler for producing two signals; and
c. a reactive hybrid divider responsive to the first of said two signals produced by said directional coupler for providing a further plurality of output signals.

* * * * *